United States Patent
Kim

(12) United States Patent (10) Patent No.: US 6,922,217 B2
(45) Date of Patent: Jul. 26, 2005

(54) AMORPHOUS SILICON THIN-FILM TRANSISTOR LIQUID CRYSTAL DISPLAY

(75) Inventor: Dong-Gyu Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/293,095

(22) Filed: Nov. 13, 2002

(65) Prior Publication Data

US 2003/0222311 A1 Dec. 4, 2003

(30) Foreign Application Priority Data

May 28, 2002 (KR) ........................................ 2002-29664

(51) Int. Cl.[7] .......................... G02F 1/136; H01L 29/10
(52) U.S. Cl. .......................................... 349/43; 257/66
(58) Field of Search ....................... 349/42–48; 257/66; 463/17

(56) References Cited

U.S. PATENT DOCUMENTS

| | | | |
|---|---|---|---|
| 5,453,858 A | 9/1995 | Yamazaki | ..................... 359/59 |
| 5,585,666 A | 12/1996 | Imamura | ..................... 257/668 |
| 5,969,377 A * | 10/1999 | Seo | ............................. 257/72 |
| 6,175,395 B1 * | 1/2001 | Yamazaki et al. | ............ 349/44 |
| 6,528,357 B2 * | 3/2003 | Dojo et al. | .................. 438/151 |
| 6,639,634 B1 * | 10/2003 | Zhang et al. | .................. 349/54 |
| 2002/0140654 A1 | 10/2002 | Kim et al. | |

* cited by examiner

*Primary Examiner*—Craig A. Thompson
(74) *Attorney, Agent, or Firm*—F. Chau & Associates, LLC

(57) ABSTRACT

In an amorphous silicon thin film transistor-liquid crystal display device and a method of manufacturing the same, gate patterns including a gate line and a gate electrode are formed on an insulation substrate having a display region and a driving circuit region on which a plurality of shift registers are formed, a gate insulating film, active layer patterns and data patterns including source and drain electrodes are formed successively on the substrate, a passivation layer on the substrate has a first contact hole exposing a drain electrode of the display region and second and third contact holes respectively exposing a gate electrode and source and drain electrodes of a first transistor of each of the shift registers, an electrode patterns on the passivation layer include a first electrode connected to the drain electrode of the display region through the first contact hole and a second electrode connecting the gate electrode to the source and drain electrodes of the first transistor through the second and third contact holes, and the gate driving circuit including the shift registers and the wirings are integrated on the insulating substrate without an additional process, thereby simplifying the manufacturing process.

21 Claims, 15 Drawing Sheets

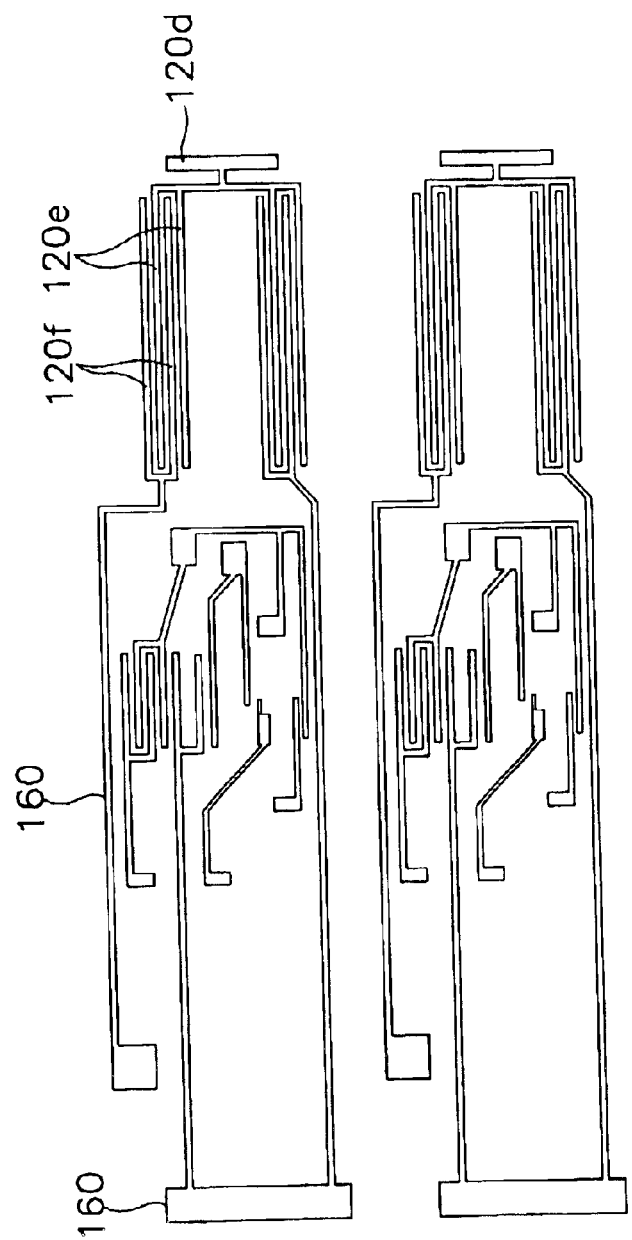

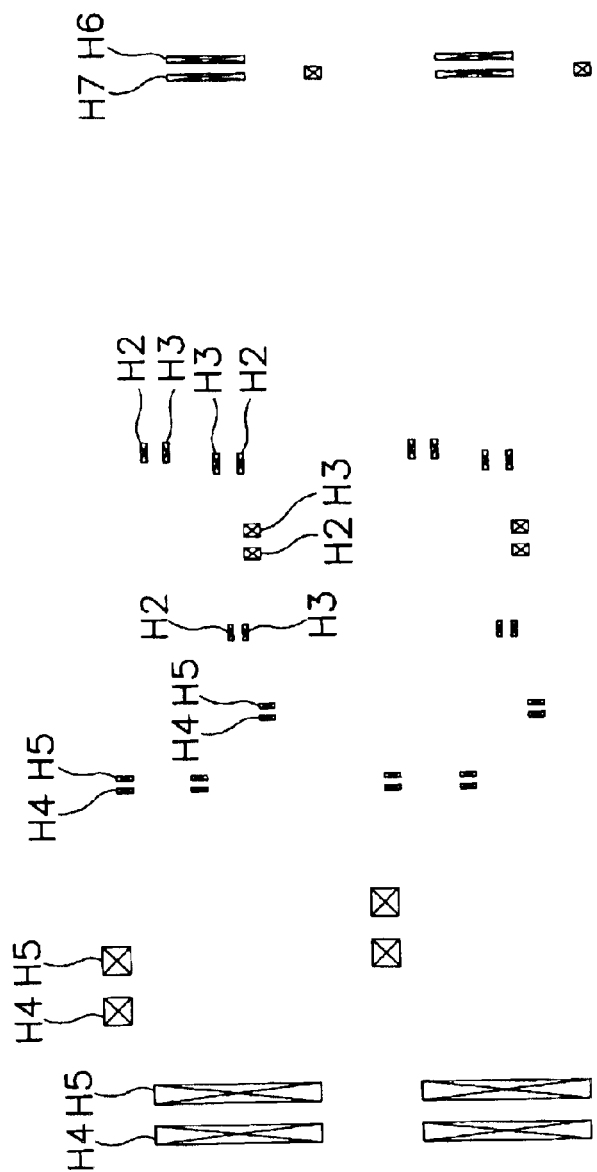

FIG. 10B
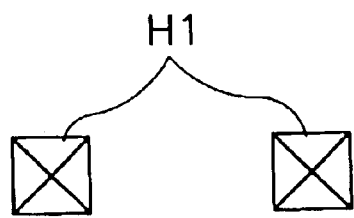
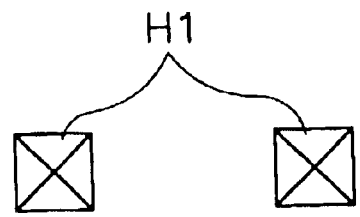

AMORPHOUS SILICON THIN-FILM TRANSISTOR LIQUID CRYSTAL DISPLAY

BACKGROUND OF THE INVENTION

1. Field of the Invention

The present disclosure relates to a liquid crystal display ("LCD") device and a method of manufacturing the same and, more particularly, to an amorphous silicon thin film transistor-liquid crystal display device ("TFT-LCD") in which a gate driving circuit is integrated on an amorphous silicon thin film transistor ("TFT") substrate, and a method of manufacturing the same.

2. Description of the Related Art

In this information age, electronic display devices are becoming more important as information transmission media and various electronic display devices are widely applied in industrial apparatus and home appliances. Such electronic display devices are being continuously improved to have new functions appropriate for the various demands of an information society.

In general, electronic display devices display and transmit various pieces of information to users who utilize such information. That is, the electronic display devices convert electric information signals output from electronic apparatus into light information signals recognized by users through their eyes.

Electronic display devices may be categorized into emissive display device types and non-emissive display device types, where an emissive display device displays light information signals through a light emission phenomena thereof and a non-emissive display device displays the light information signals through a reflection, a scattering or an interference thereof. The emissive display device type may include a cathode ray tube ("CRT"), a plasma display panel ("PDP"), a light emitting diode ("LED") and/or an electroluminescent display ("ELD"), for example. Emissive display devices are also called active display devices.

The non-emissive display devices, which are also called passive display devices, may include a liquid crystal display ("LCD"), an electrochemical display ("ECD") and/or an electrophoretic image display ("EPID"), for example.

The CRT has been typically used as a television receiver display and as a monitor for a computer. The CRT has already been used for a long time since it generally has a relatively high quality and a low manufacturing cost. The CRT, however, has some disadvantages such as, for example, a heavy weight, a large volume and a high power dissipation.

Recently, the demand for improved electronic display devices has led to great interest in devices such as flat panel displays, which can offer excellent characteristics including thin thickness, light weight, low driving voltage and low power consumption. Such flat panel display devices may be manufactured according to improved semiconductor technologies.

In the flat panel devices, a liquid crystal display ("LCD") device has been widely utilized for various electronic devices because the LCD device offers a thin thickness and a low power dissipation while maintaining a relatively high display quality approximately equal to that of a CRT. In addition, the LCD device can be operated under a low driving voltage, and can be easily manufactured such that the LCD device is widely used for various electronic apparatuses.

The LCD typically comprises two substrates, each of the substrates having an electrode, with a liquid crystal layer interposed therebetween. In the LCD, a voltage is applied across the electrodes to realign liquid crystal molecules and control an amount of light transmitted through the molecules.

With typical LCDs, the device typically includes electrodes formed on each of two substrates and a thin film transistor for switching a voltage applied to each of the electrodes. Generally, the thin film transistor is formed on one of the two substrates.

The LCD device types utilizing the thin film transistor in a pixel region may be divided into an amorphous silicon type TFT-LCD and a polycrystalline silicon type TFT-LCD. The polycrystalline silicon TFT-LCD device has a relatively low power consumption and cost, but the polycrystalline silicon type TFT-LCD manufacturing process is complicated compared to that of the amorphous silicon type TFT-LCD device. Accordingly, the polycrystalline silicon TFT-LCD is mainly used for small-sized displays such as, for example, mobile telephones. The amorphous silicon TFT-LCD is suitable for a large-sized displays and has a high yield, so it is used for displays having a large screen such as, for example, a notebook personal computer ("PC"), an LCD monitor, a high definition television ("HDTV") receiver monitor, and the like.

As shown in FIG. 1 for a typical polycrystalline silicon TFT-LCD device, a data driving circuit 12 and a gate driving circuit 14 are formed on a glass substrate 10 on which pixel arrays are formed. A terminal 16 is connected to an integrated printed circuit board ("PCB") 20 through a film cable 18. This structure can reduce manufacturing costs and minimize the power loss by integrating the driving circuits.

As shown in FIG. 2 for a typical amorphous silicon TFT-LCD device, a data driving chip 34 is formed on a flexible PCB 32 by a chip on film ("COF") method and a data PCB 36 is connected to a data line terminal of pixel array through the flexible PCB 32. Further, a gate driving chip 40 is formed on a flexible PCB 38 by the COF method, and a gate PCB 42 is connected to a gate line terminal of pixel array through the flexible PCB 38.

A recently suggested method is an integrated PCB technology wherein a gate power supply is mounted on a data PCB to thereby eliminate a gate PCB. Korea Patent Laid-Open Publication Number 2000-66493 disclosed an LCD module adopting an integrated PCB from which the gate PCB is removed.

However, even if the integrated PCB is adopted, a flexible PCB on which a gate driving circuit is formed is still used. Accordingly, since a process of assembling a plurality of flexible PCBs on a glass substrate is carried out in the manufacture of amorphous silicon TFT-LCD devices, an outer lead bonding ("OLB") process is more complicated as compared to the polycrystalline silicon TFT-LCD, thereby raising the manufacturing cost.

SUMMARY OF THE INVENTION

Embodiments of the present disclosure provide an amorphous silicon TFT-LCD device in which a gate driving circuit is integrated on an amorphous silicon TFT substrate. The present disclosure also provides for a method of manufacturing an amorphous silicon TFT-LCD device in which a gate driving circuit is integrated on an amorphous silicon TFT substrate.

An embodiment is provided wherein an amorphous silicon TFT-LCD device comprising an insulating substrate including a display region on which a pixel array is formed and a driving circuit region on which a plurality of shift registers are formed. A gate pattern is formed on the substrate and includes a gate line and a gate electrode. A gate insulating film is formed on the substrate including the gate pattern. An active layer pattern is formed on the gate insulating film and a data pattern is formed on the substrate and the active layer pattern. The data pattern includes a source electrode making contact with a first region of the active layer pattern, a drain electrode making contact with a second region of the active layer pattern and a data line connected to the drain electrode. A passivation layer is formed on the substrate including the data pattern and has a first contact hole exposing the drain electrode of the display region, a second contact hole exposing the gate electrode of a first transistor of each of the shift registers and a third contact hole exposing the source and drain electrodes of the first transistor. An electrode pattern is formed on the passivation layer and includes a first electrode connected to the drain electrode of the display region through the first contact hole and a second electrode connecting the gate electrode and the source and drain electrodes of the first transistor to each other through the second and third contact holes.

In addition, an embodiment of the present disclosure is realized by an amorphous silicon TFT-LCD device comprising an insulating substrate including a display region on which a plurality of gate lines and a plurality of data lines are formed and a gate driving circuit region. Shift registers are formed on the substrate of the gate driving circuit region that include a number of thin film transistors having a gate electrode and source and drain electrodes. The shift registers sequentially select gate lines. Main wirings are disposed on the substrate of the gate driving circuit region to apply a signal to each of the shift registers and formed of the same layer from a first shift register to a last shift register. A passivation layer is formed on the substrate including the shift registers and the main wirings and has a first contact hole partially exposing a data line of the display region, a second contact hole exposing a gate electrode of a first transistor of each of the shift registers and a third contact hole exposing the source and drain electrodes of the first transistor. An electrode pattern is formed on the passivation layer and includes a first electrode connected with the data line of the display region through the first contact hole and a second electrode connecting the gate electrode and the source and drain electrodes of the first transistor to each other through the second and third contact holes.

A method of manufacturing an amorphous silicon TFT-LCD device is also provided. After forming a gate pattern including a gate line and a gate electrode on an insulating substrate having a display region on which a pixel array is formed and a driving circuit region on which a plurality of shift registers are formed, a gate insulating film is formed on the substrate including the gate pattern. An active layer pattern is formed on the gate insulating film above the gate electrode. A data pattern is formed on the substrate and the active layer pattern. The data pattern includes a source electrode making contact with a first region of the active layer pattern, a drain electrode making contact with a second region of the active layer pattern and a data line connected with the drain electrode. After forming a passivation layer on the substrate including the data pattern, the passivation layer and the gate insulating film are etched to form a first contact hole exposing the drain electrode of the display region, a second contact hole exposing the gate electrode of a first transistor of each of the shift registers, and a third contact hole exposing source and drain electrodes of the first transistor. Thereafter, an electrode pattern is formed on the passivation layer. The electrode pattern includes a first electrode connected with the drain electrode of the display region through the first contact hole and a second electrode connecting the gate electrode and the source and drain electrodes of the first transistor to each other through the second and third contact holes.

In addition, a method of manufacturing an amorphous silicon TFT-LCD device is provided wherein a gate pattern is formed. The gate pattern includes a gate line and a gate electrode on an insulating substrate having a display region on which a pixel array is formed and a driving circuit region on which a plurality of shift registers are formed. After forming a gate insulating film on the substrate including the gate pattern, an active layer pattern and a data pattern on the gate insulating film using one mask are formed. The data pattern includes a source electrode making contact with a first region of the active layer pattern, a drain electrode making contact with a second region of the active layer pattern and a data line connected with the drain electrode. A passivation layer is formed on the substrate including the data pattern. The passivation layer and the gate insulating film are etched to form a first contact hole exposing the drain electrode of the display region, a second contact hole exposing the gate electrode of a first transistor of each of the shift registers, and a third contact hole exposing source and drain electrodes of the first transistor. Then, an electrode pattern is formed on the passivation layer. The electrode pattern includes a first electrode connected with the drain electrode of the display region through the first contact hole and a second electrode connecting the gate electrode and the source and drain electrodes of the first transistor to each other through the second and third contact holes.

According to an amorphous silicon TFT-LCD device of the present disclosure, without an additional process, the gate driving circuit including the shift registers and the wirings is integrated on the insulating substrate on which a pixel array is formed. That is, several layers, which can be comprised of the same material, are formed of the same layer to thereby decrease the number of mask. Further, a conductive film for pixel electrode connects the gate electrode and source and drain electrodes of the first transistor constituting the shift registers in the gate driving circuit with each other, thereby simplifying the manufacturing process.

Further, the main wirings for applying a signal to each of the shift registers are formed of the same layer from the first shift register to the last shift register, so that the resistance of the main wiring is minimized to increase field effect mobility of the amorphous silicon TFT-LCD.

BRIEF DESCRIPTION OF THE DRAWINGS

The above and other features and advantages of the present disclosure will become more apparent by describing preferred embodiments thereof in detail with reference to the accompanying drawings in which:

FIGS. 8A to 11B are plan views illustrating a method of manufacturing an amorphous silicon TFT-LCD device in accordance with an embodiment of the present disclosure.

DESCRIPTION OF PREFERRED EMBODIMENTS

For an exemplary amorphous silicon TFT-LCD device type according to an embodiment of the present disclosure, a method is provided whereby the driving circuits and the pixel array are simultaneously formed on a substrate to thereby decrease the number of assembly process steps to a number comparable with that of the polycrystalline silicon TFT-LCD device type. Hereinafter, a preferred embodiment of the present disclosure will be described in detail with reference to the accompanying drawings.

Figure 1:
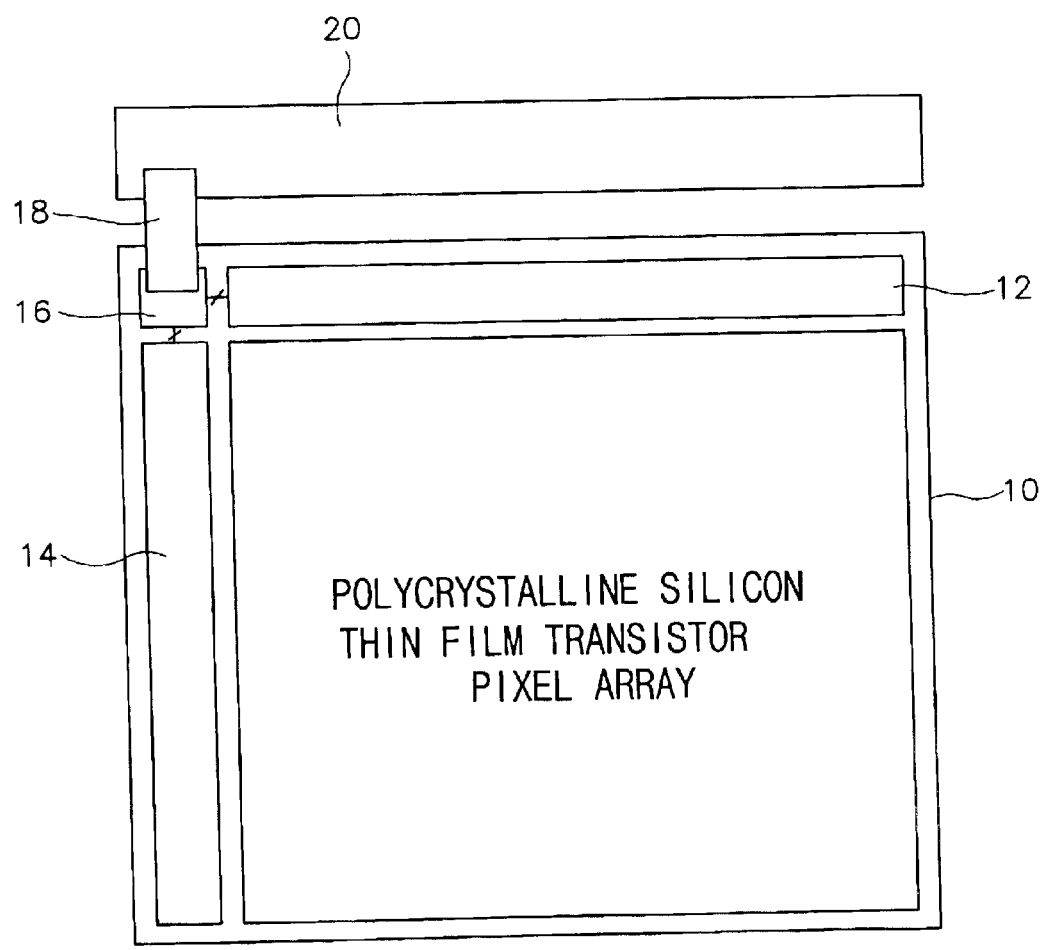
FIG. 1 is a plan view schematically illustrating a conventional polycrystalline silicon TFT-LCD device.
Figure 2:
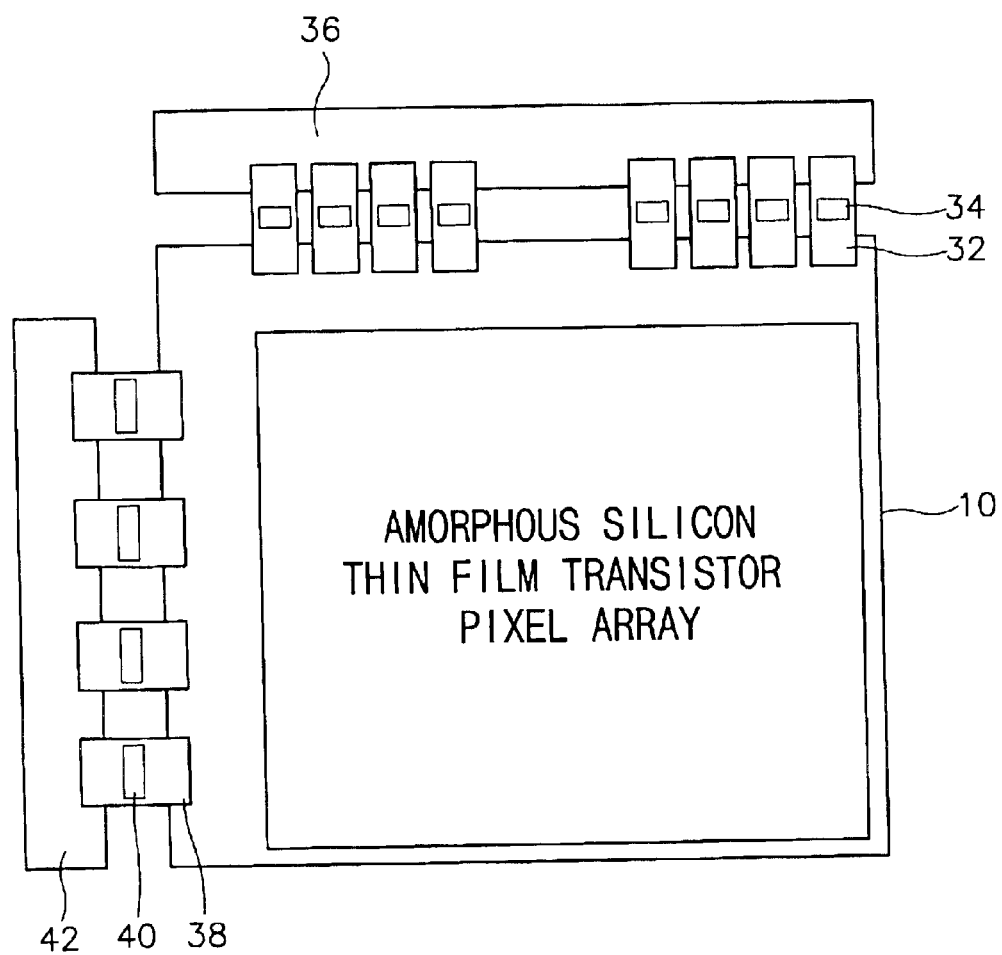
FIG. 2 is a plan view schematically illustrating a conventional amorphous silicon TFT-LCD device.
Figure 3:
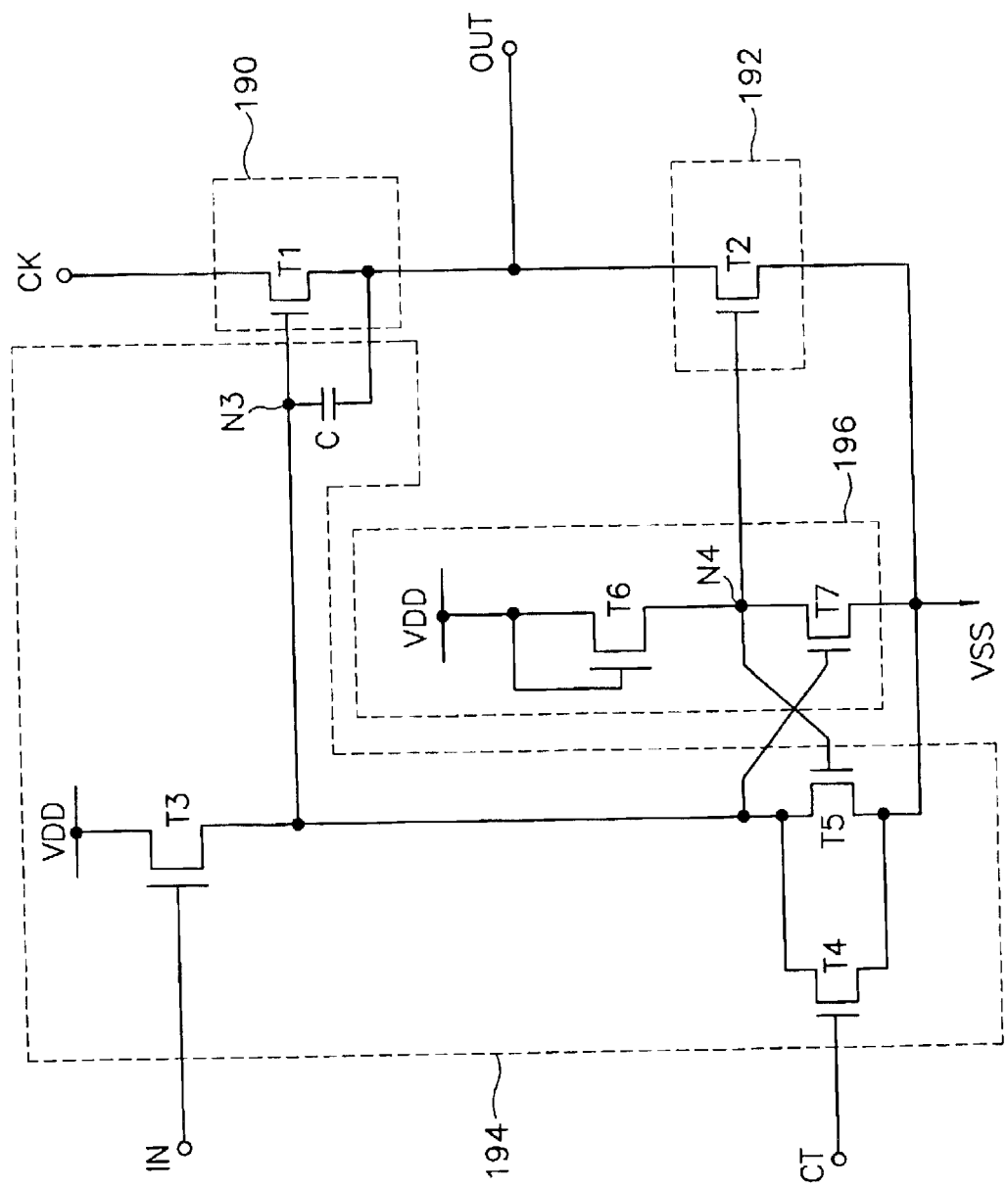
FIG. 3 is a circuit diagram of shift registers applied to a gate driving circuit region in an amorphous silicon TFT-LCD device according to an embodiment of the present disclosure.
Figure 4:
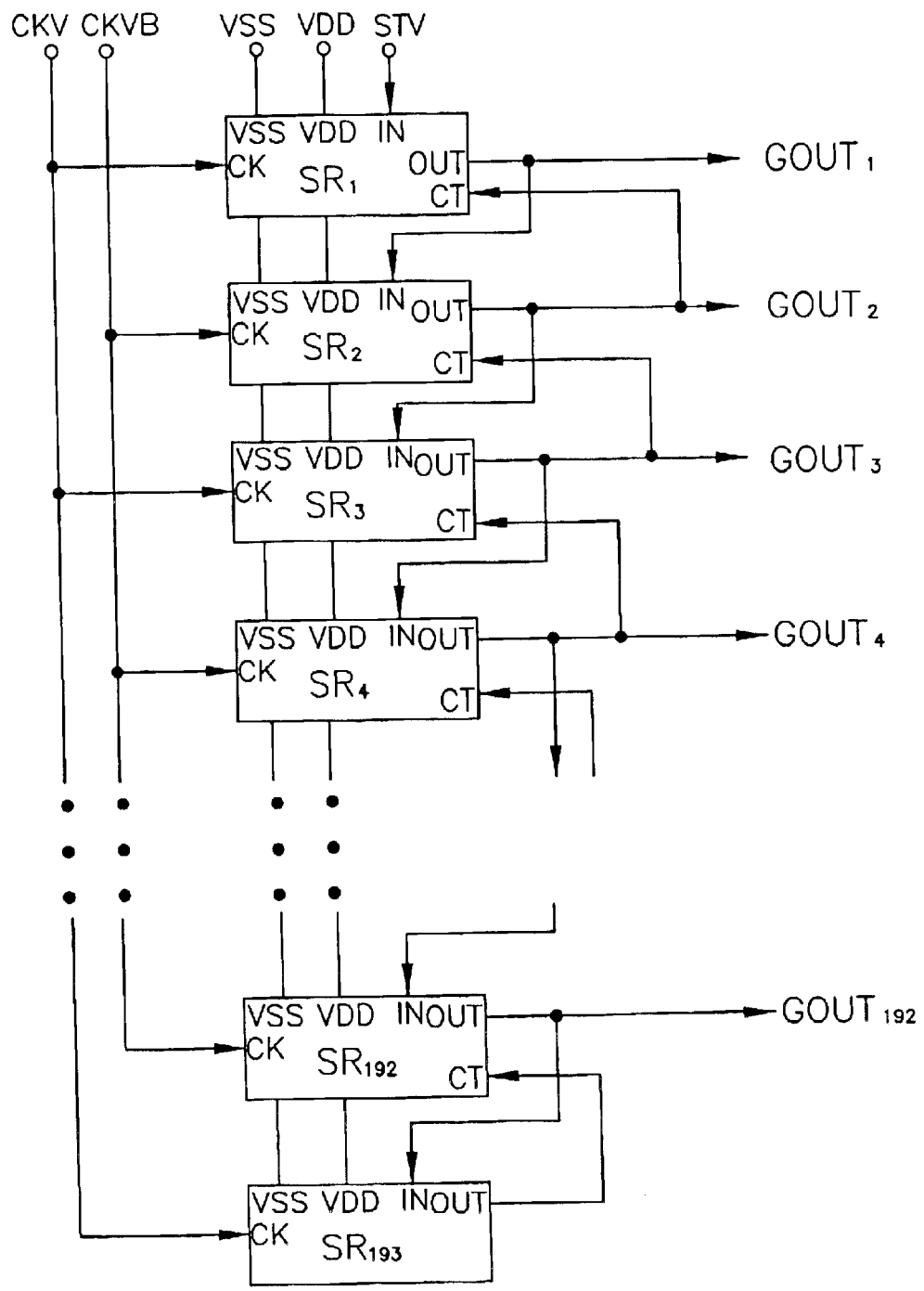
FIG. 4 is a block diagram of the shift registers of FIG. 3.

FIG. 3 is a circuit diagram of a shift register as applied to a gate driving circuit region in an amorphous silicon TFT-LCD device according to an embodiment of the present disclosure. FIG. 4 is a block diagram of a number of interconnected shift registers of FIG. 3.

Referring to FIGS. 3 and 4, the gate driving circuit has a plurality of shift registers ($SR_1$, $SR_2$, ... $SR_{93}$) connected subordinately. That is, an output terminal ("OUT") of each of the shift registers is connected to an input terminal ("IN") of the next shift register. There are 192 shift registers ($SR_1$ through $SR_{192}$) corresponding to 192 gate lines and one dummy shift register ("$SR_{193}$"). Each of the shift registers has an input terminal ("IN"), an output terminal ("OUT"), a control terminal ("CT"), a clock signal input terminal ("CK"), a first power source terminal ("VSS") and a second power source terminal ("VDD").

A start signal ("ST") is input to the input terminal ("IN") of the first shift register ("$SR_1$"). The output signal ($GOUT_1$ through $GOUT_{192}$, respectively) of each of the shift registers is connected to the corresponding gate line, and then, a plurality of gate lines are sequentially selected by the output signal. A first clock signal ("CKV") is provided to the odd-numbered shift registers, while a second clock signal ("CKVB") is provided to the even-numbered shift registers. The phase of the first clock signal ("CKV") is reverse to that of the second clock signal ("CKVB").

Each of the shift registers includes a pull-up section 190, a pull-down section 192, a pull-up driving section 194 and a pull-down driving section 196.

The pull-up section 190 provides a corresponding clock signal of the first and second clock signals to the output terminal ("OUT"). The pull-down section 192 provides the first power source ("VSS") to the output terminal ("OUT").

The pull-up driving section 194 is connected to the input node of the pull-up section 190 such that it responds to the end of the input signal to charge a capacitor for turning on the pull-up section 190 and responds to the end of the output signal of the next shift register to discharge the capacitor for turning off the pull-up section 190.

The pull-down driving section 196 is connected to the input node of the pull-down section 192 such that it responds to the end of the input signal to turn on the pull-down section 192 and responds to the end of the output signal of next shift register to turn off the pull-down section 192.

The pull-up section 190 includes a first driving transistor T1 having a drain connected to the clock signal input terminal CK, a gate connected to a third node N3 and a source connected to the output terminal OUT.

The pull-down section 192 includes a second driving transistor T2 having a drain connected to the output terminal OUT, a gate connected to a forth node N4, and a source connected to the clock signal input terminal CK.

The pull-up driving section 194 includes a capacitor C and three control transistors T3, T4 and T5. The capacitor C is connected between the third node N3 and the output terminal OUT. A third control transistor T3 has a drain connected to the second power source VDD, a gate connected to the input terminal IN and a source connected to the third node N3. A forth control transistor T4 has a drain connected to the third node N3, a gate connected to the control terminal CT and a source connected to the first power source VSS. A fifth control transistor T5 has a drain connected to the third node N3, a gate connected to the forth node N4 and a source connected to the first power source VSS.

The pull-down driving section 196 includes two control transistors T6 and T7. The drain and gate of the sixth control transistor T6 are connected to the second power source VDD in common, while the source of the sixth control transistor T6 is connected to the forth node N4. The seventh control transistor T7 has a drain connected to the forth node N4, a gate connected to the third node N3 and a source connected to the first power source VSS.

Figure 5:
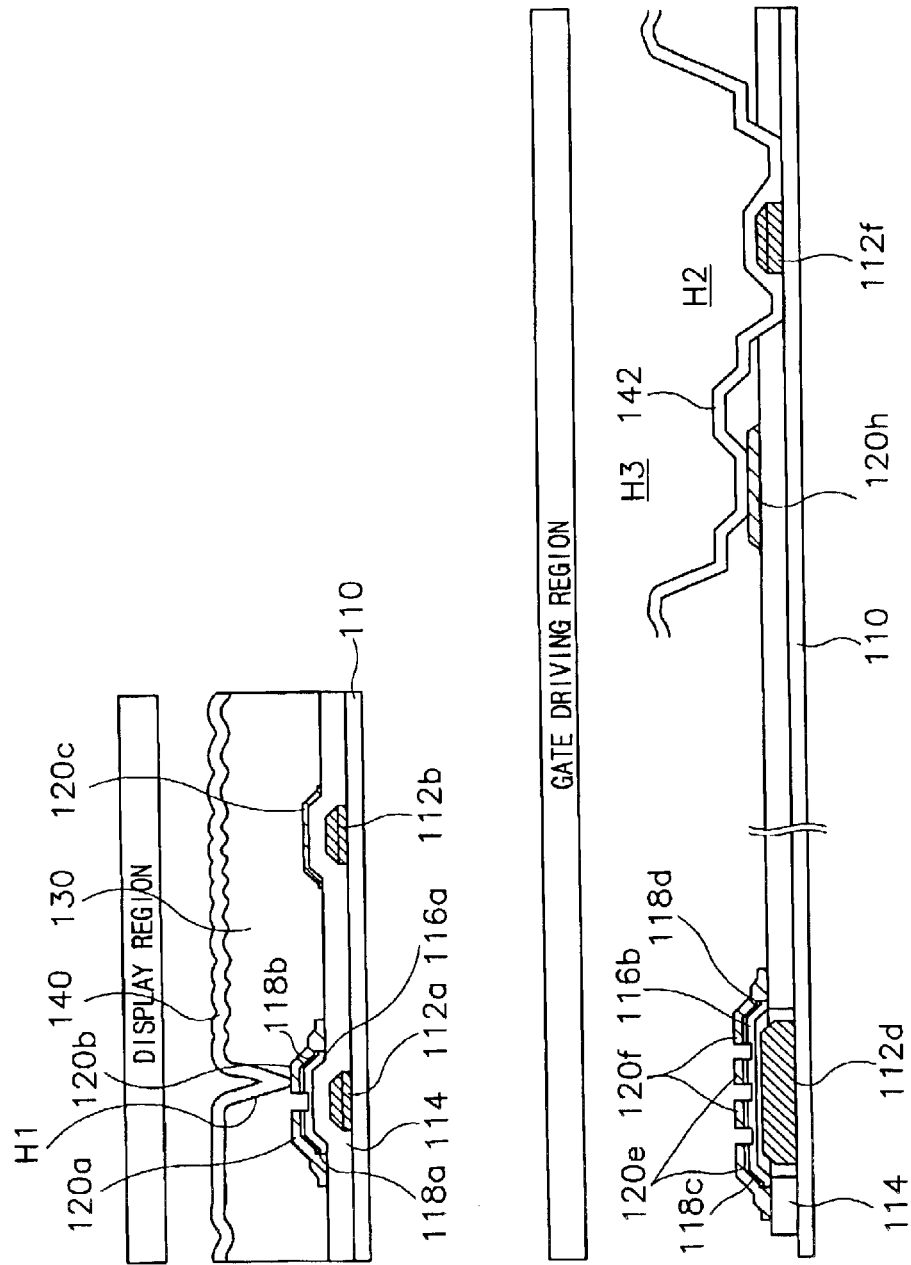
FIG. 5 is a cross-sectional view of an amorphous silicon TFT-LCD device in accordance with an embodiment of the present disclosure.
Figure 6:
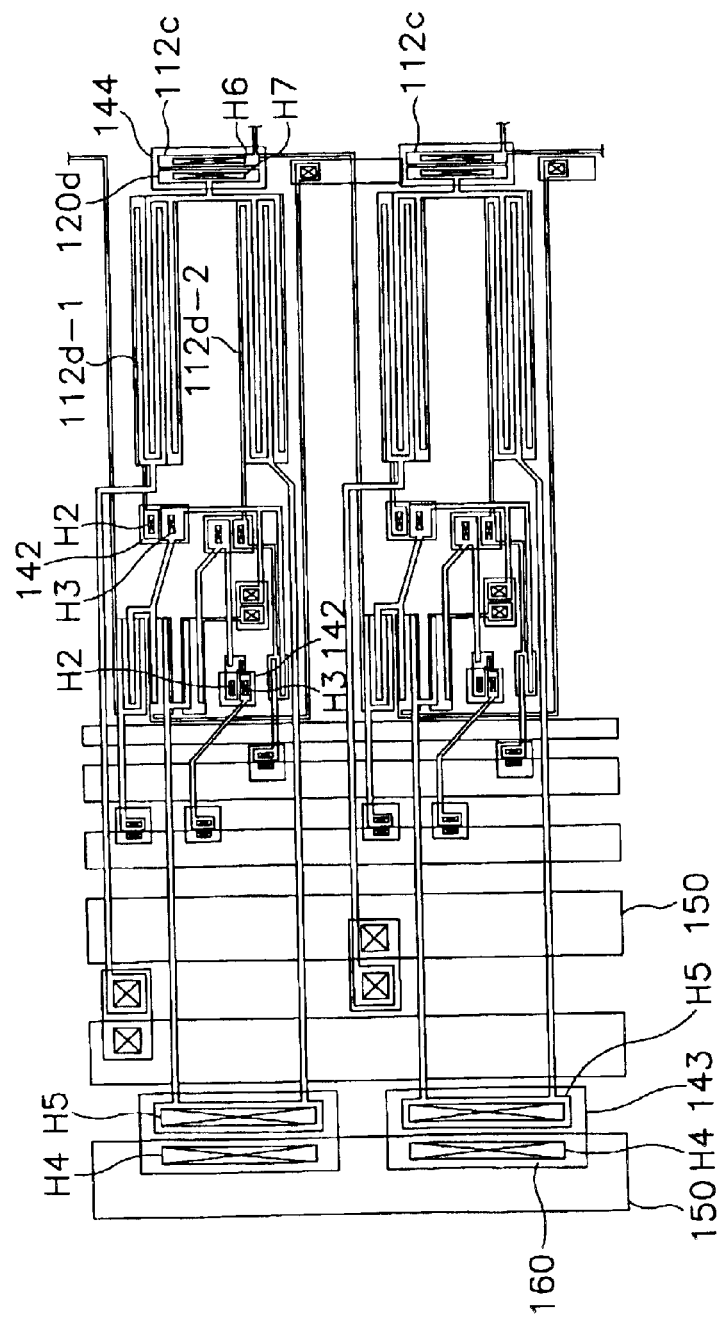
FIG. 6 is a plan view illustrating a gate driving circuit region of an amorphous silicon TFT-LCD device according to an embodiment of the present disclosure.

FIG. 5 is a cross-sectional view of the amorphous silicon TFT-LCD device according to one embodiment of the present disclosure, and illustrates a display region and a gate driving circuit region. FIG. 6 is a plan view of the gate driving circuit region, and FIG. 7 is a plan view of the display region.

Figure 7:
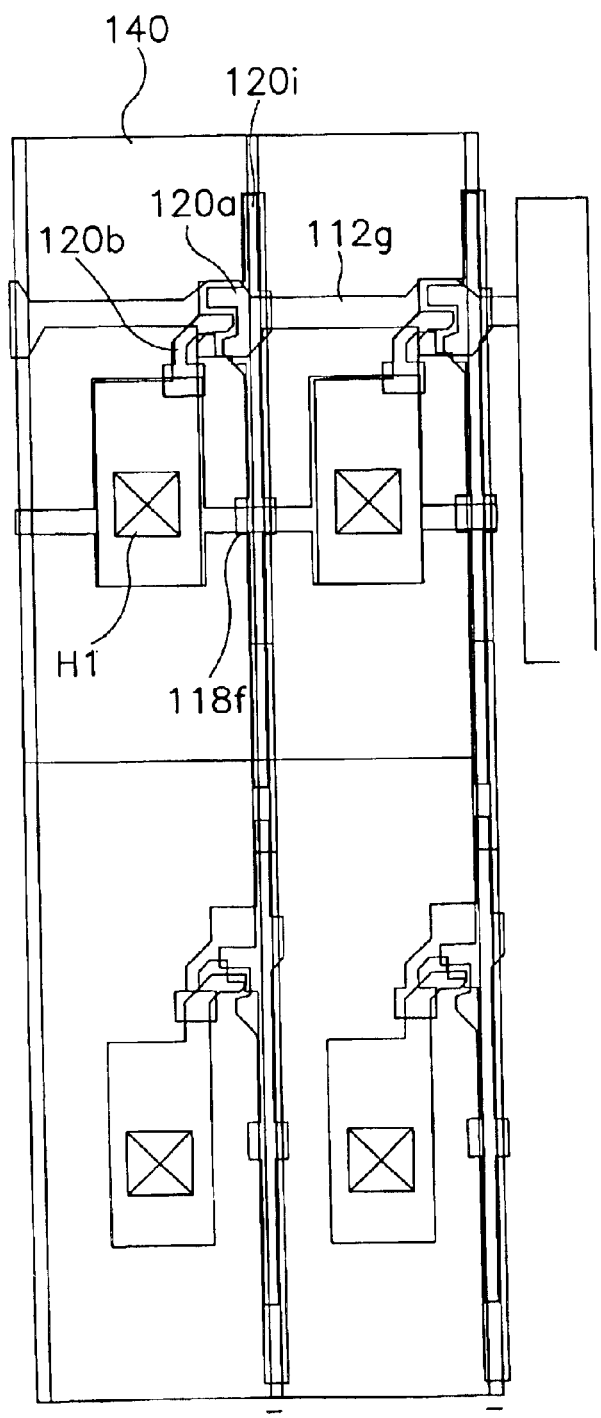
FIG. 7 is a plan view illustrating a display region of an amorphous silicon TFT-LCD device according to an embodiment of the present disclosure.

Referring to FIGS. 5 through 7, gate patterns 112a, 112b, 112c, 112d, 112e, 112f and 112g are disposed on the display region and the gate driving circuit region of an insulating substrate 110. Each of the gate patterns includes a gate line 112g and a gate electrode branched from the gate line 112g. Also, the gate pattern 112b in the display region is provided as a lower electrode of a storage capacitor. Between the display region and the gate driving circuit region, a gate pad 112c is formed of the same layer as in the gate pattern. The gate pad 112c is connected to one end of the gate line 112g and applies a scanning signal to the gate line 112g by receiving the scanning signal from an external source. Preferably, the gate patterns 112a, 112b, 112c, 112d, 112e, 112f and 112g are formed of a composite film consisting of a chrome ("Cr") layer having a thickness of about 500 521 and an aluminum-neodymium ("AlNd") having a thickness of about 200 Å.

A gate insulating film 114 is formed on the entire surface of the substrate 100 including the gate patterns 112a, 112b, 112c, 112d, 112e, 112f and 112g. The gate insulating film 114 preferably has a thickness of about 4500 Å and comprises silicon-nitride ("SiNx").

On the gate insulating film 114 of the display region and the gate driving circuit region, there are disposed active layer patterns including first impurity regions 118a and 118c, second impurity regions 118b and 118d, and channel regions 116a and 116b formed between the first impurity regions and the second impurity regions. The channel regions 116a and 116b comprises amorphous silicon and has a thickness of about 200 Å, and the first and second impurity regions 118a, 118b, 118c and 118d comprises n-type amorphous silicon and have a thickness of about 500 Å.

Data patterns 120a, 120b, 120c, 120e, 120f, 120h and 120i are disposed on the active layer patterns. The data patterns include source electrodes 120a and 120e respectively making contact with the first impurity regions 118a and 118c, drain electrodes 120b and 120f respectively making contact with the second impurity regions 118b and 118d, and a data line 120i connected to the source electrodes 120a and 120e and formed perpendicular to the gate line 112g. Above the capacitor lower electrode 112b, there is disposed a capacitor upper electrode 120c comprising the same layer as in the data patterns with the gate insulating film 114 interposed therebetween. On the pad region between the display region and the gate driving circuit region, there is formed a data pad 120d comprising the same layer as in the data patterns. Preferably, the data patterns 120a, 120b, 120c, 120d, 120e, 120f and 120g are comprised of chrome ("Cr") film having a thickness of about 1500 to about 4000 Å.

The gate electrode 112d constituting the thin film transistor of the gate driving circuit region is formed to a box structure and the source and drain electrodes 120e and 120f are formed to an interdigital structure having multi-channels. Being spaced apart from each other, the odd-numbered source electrode 120e and the even-numbered drain electrode 120f are disposed by turns.

As shown in FIG. 6, driving transistors (T1 and T2 of FIG. 3) of the shift registers are disposed on a portion of the gate driving circuit region adjacent to the display region. The driving transistors apply selectively signals of Von and Voff to the gate output terminal. On a part of the gate driving circuit region farthest away from the display region, there are disposed main wirings 150 (VSS, CK, CKB, VDD and VSS2) applying the signal to each of the shift registers. Control transistors (T3, T4, T5, T6 and T7 of FIG. 3) are disposed between the driving transistor region and the wiring region.

Typically, in the case that a gate output signal is formed using the shift registers in the large-sized and fine-pitched TFT-LCD device in which a gate-on time is short and an RC delay of the gate line is very long, the resistance of the main wirings applying the signals to each of the shift registers and the load capacitor should be minimized because the field effect mobility of the amorphous silicon TFT is very low. Accordingly, in the present disclosure, the first shift register through the last shift register, which correspond to the main wirings 150, are formed of the same layer without an additional contact, thereby minimizing the resistance of the main wiring 150. Preferably, to reduce the wiring resistance, the main wirings 150 are formed of a metal film having a lower sheet resistance than the metal films constituting the gate patterns 112a, 112b, 112c, 112d, 112e, 112f and 112g and the data patterns 120a, 120b, 120c, 120d, 120e, 120f and 120g. In the present disclosure, the main wiring 150 is formed of the same layer as in the gate patterns because the gate patterns are comprised of aluminum ("Al") and the data patterns are comprised of chrome ("Cr").

In addition, branch wirings 160 for connecting the main wiring 150 to the transistor terminals T1 through T7 of each of the shift registers are formed of a different layer from the main wirings 150. Accordingly, if the main wirings 150 are formed of the same layer as in the gate pattern, the branch wirings 160 are formed of the same layer as in the data pattern. Also, to reduce the capacitance of the main wirings 150, it is preferred that a portion of the branch wiring 160s where the branch wiring 160 and the main wiring 150 cross each other is formed to have a narrow line width.

On the entire surface of the substrate 110, including the data patterns 120a, 120b, 120c, 120e, 120f, 120h and 120i, there is formed a passivation layer 130 having a first contact hole H1 exposing the drain electrode 120b of the display region, a second contact hole H2 exposing a contact gate pattern 112f in the gate driving circuit region, a third contact hole H3 exposing a contact data pattern 120h in the gate driving circuit, a forth contact hole H4 exposing one of the main wirings 150 and a fifth contact hole H5 exposing one of the branch wirings 160. Also, through the passivation layer 130 of the pad region, there are formed a sixth contact hole H6 exposing the gate pad 112c and a seventh contact hole H7 exposing the data pad 112d. The passivation layer 130 is comprised of silicon nitride or a photosensitive organic material. Especially in a reflection-type LCD having a reflective electrode of uneven-shape for increasing the reflectivity, the passivation layer is preferably formed of a photosensitive organic film having an uneven surface with prominences and recesses.

The electrode patterns 140, 142 and 143 are formed on the passivation layer 130 including the first to fifth contact holes H1, H2, H3, H4 and H5. The electrode patterns include a pixel electrode (or a first electrode) 140 electrically connected with the drain electrode 120b of the display region, a second electrode 142 electrically connecting the gate pattern 112f for contact and the data pattern 112h for contact in the gate driving circuit region through the second and third contact holes H2 and H3, respectively, a third electrode 143 electrically connecting the main wiring 150 and the branch wiring 160 in the gate driving circuit region through the forth and fifth contact holes H4 and H5, respectively, and a forth electrode 144 electrically connecting the gate pad 112c and the data pad 120d through the sixth and seventh contact holes H6 and H7, respectively. Preferably, the second electrode 142 includes a first pattern connecting the gate electrode and the source and drain electrodes of the first transistor constituting the shift register to each other, and a second pattern connecting the gate electrode of the second transistor constituting the shift register to the source and drain electrodes of the third transistor. In the present embodiment, the second electrode 142 in the contact region and the forth electrode pattern 144 in the pad region electrically connect a portion of the gate pattern with a portion of the data pattern, so that the second and the forth electrodes 142 and 144 are regarded as the same kind of contact terminal.

It is preferred that the forth and fifth contact holes H4 and H5 are formed to have a line width wider than that of the branch wirings 160 to reduce the contact resistance between the third electrode and the main wirings 150 and the branch wirings 160. Further, the forth and fifth contact holes H4 and H5 are formed so as to be located in a liquid crystal layer region within a seal line used for attaching the TFT substrate to the color filter substrate or to be located under the seal line, thereby preventing metal corrosion from being caused when the seal line is exposed to an external atmosphere.

In a transmission type LCD device, the electrode patterns 140 and 142 are formed of a transparent conductive film, e.g., an indium-tin oxide ("ITO") film or an indium-zinc oxide ("IZO") film. In a reflection type LCD device, the electrode patterns are formed of an opaque conductive film having high reflectivity, e.g., aluminum alloy film or silver film.

Hereinafter, a method of manufacturing an amorphous silicon TFT-LCD device according to the present disclosure will be described in detail with reference to the accompanying drawings.

FIGS. 8A to 11B are plan views explaining a method of manufacturing an amorphous silicon TFT-LCD device according to the present disclosure. Here, each figure labeled "A" is a plan view illustrating a unit process in a gate driving circuit region, and each figure labeled "B" is a plan view illustrating a unit process in a display region.

Figure 8A:
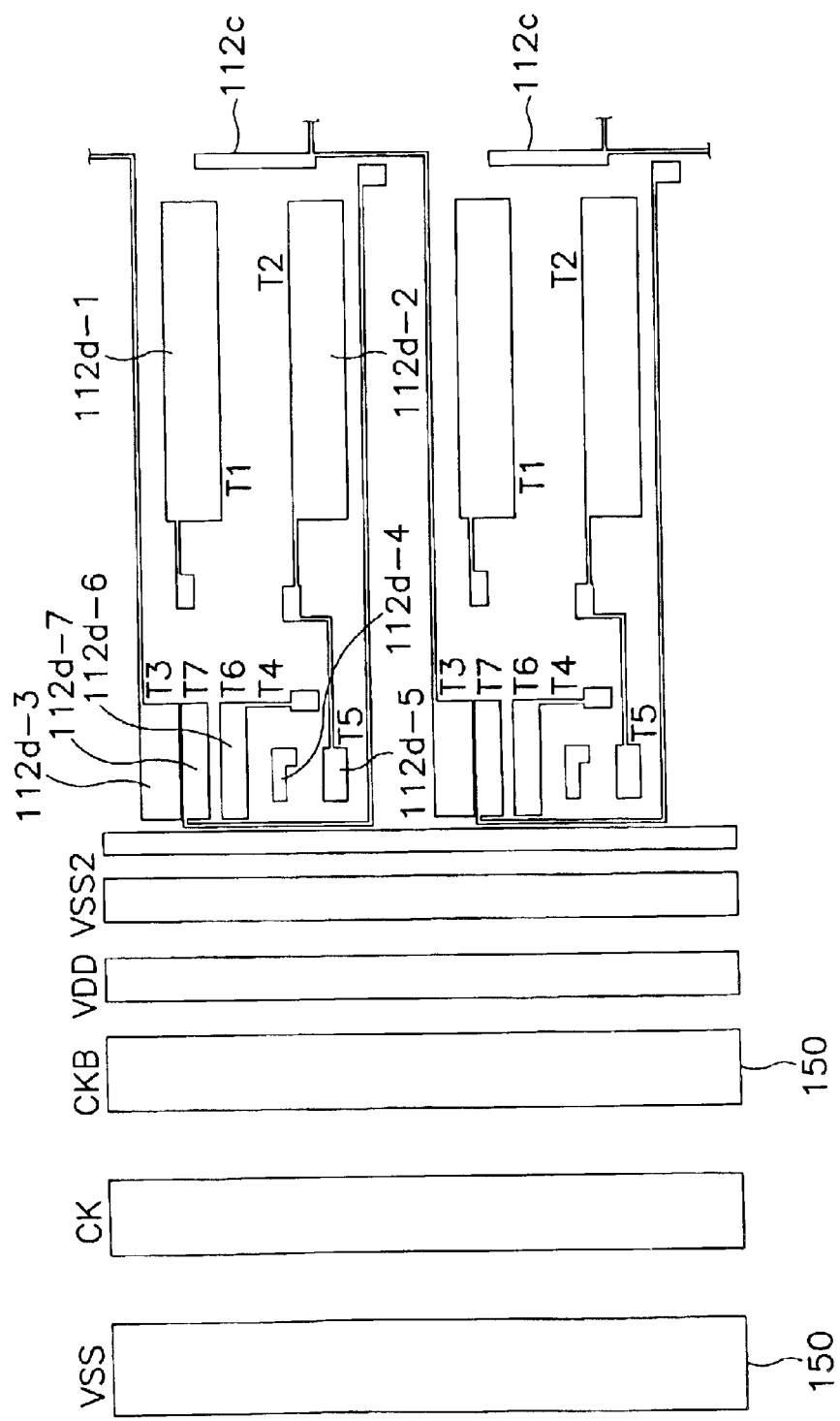
Figure 8B:
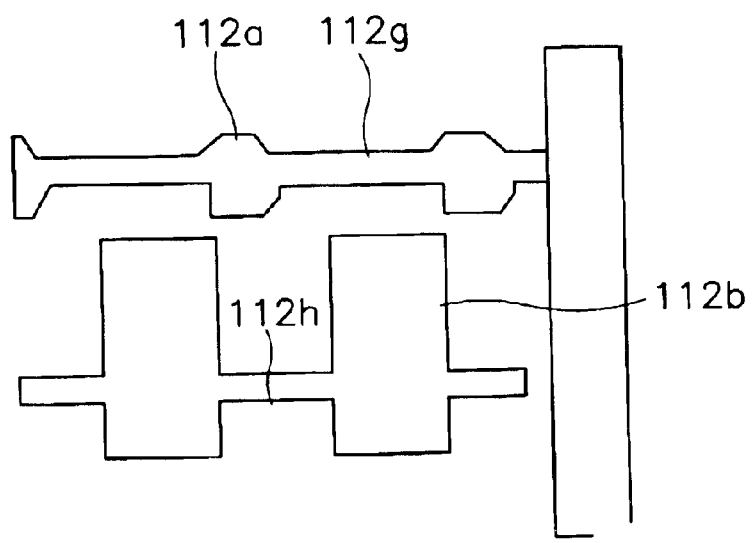

Referring to FIGS. 8A and 8B, a metal film comprising a chrome ("Cr") layer having a thickness of about 500 Å and an aluminum-neodymium ("AlNd") layer having a thickness of about 2500 Å is deposited on a substrate consisting of an insulating material such as glass, quartz or ceramic. Then, the metal film is patterned through a photolithography process using a first mask, thereby forming gate patterns 112.

The gate patterns 112 in the display region include a gate line 112g disposed in a first direction ( e.g., a horizontal direction), a capacitor lower wiring 112h disposed between the adjacent gate lines 112g to be arranged parallel with the gate line 112g, a capacitor lower electrode 112b overlapped with the capacitor lower wiring and formed in the unit pixel region, and a gate electrode 112a branched from the gate line 112g. When the capacitor lower wiring 112h is formed separately from the gate line 112g as in this embodiment, the load capacitor of the gate output terminal of the shift register can be reduced to about ½ to ⅓ in comparison with the front gate structure.

Between the display region and the gate driving circuit region, there is formed a gate pad 112c comprised of the same layer as in the gate pattern. The gate pad 112c is connected to one end of the gate line 112g and applies a scanning signal received from an external source to the gate line 112g.

Gate electrodes 112d-1 and 112d-2 of a first driving transistor T1 and a second driving transistor T2 in each of the shift registers disposed on the gate driving circuit region, have a wider line width than those of the gate electrodes 112d-3, 112d-4, 112d-5, 112d-6 and 112d-7 of a third to a seventh control transistor T3 to T7.

Also, to minimize the wiring resistance, main wirings 159 comprised of the same layer as in the gate pattern 112 are formed on the substrate of the gate driving circuit region. Preferably, the main wirings 150 are formed of the same layer from the corresponding first shift register to the corresponding last shift register without an additional contact.

Figure 9B:
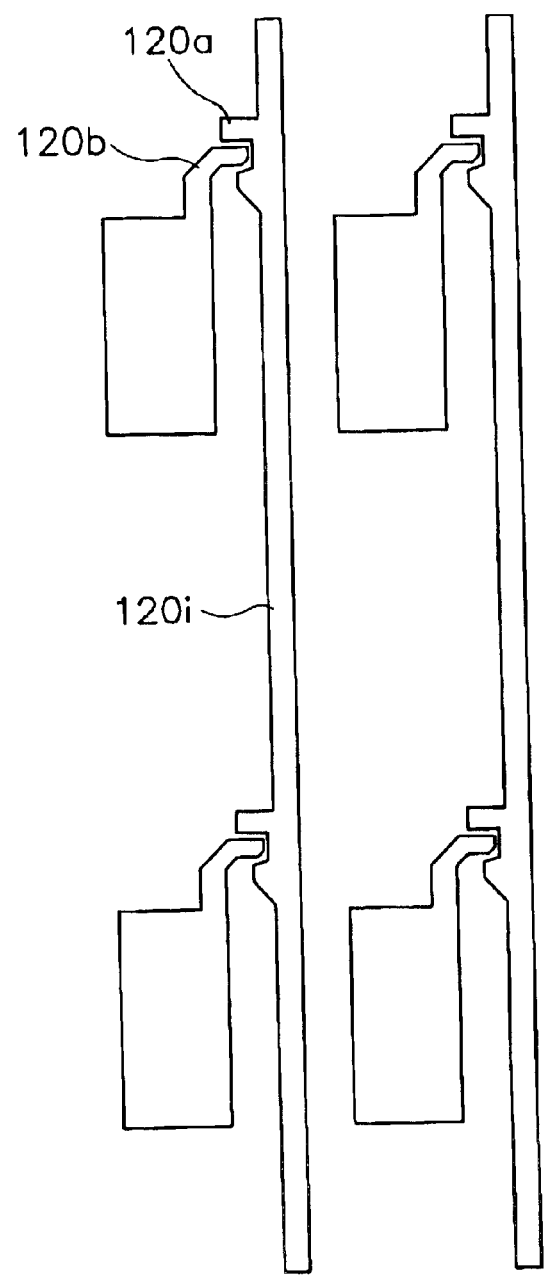

Referring to FIGS. 9A and 9B, after forming the gate patterns 112 and the main wirings 150 as described above, silicon nitride is deposited to a thickness of about 4500 Å by a Plasma Enhanced Chemical Vapor Deposition ("PECVD") method to thereby form a gate insulating film (see reference numeral 114 of FIG. 5).

Then, the active layer patterns (see reference numerals 116 and 118 in FIG. 5) are formed on the gate insulating film 114 through a photolithography process using a second mask. Specifically, an amorphous silicon film is deposited on the gate insulating film 114 to a thickness of about 2000 Å by PECVD, and an n+ doped amorphous silicon film is deposited to a thickness of about 500 Å by PECVD on the amorphous silicon film. Then, through a photolithography process using the second mask, the films are patterned to form the active layer patterns including a channel region 116 comprising the amorphous silicon film and first and second impurity regions (e.g., source and drain regions) 118 comprising the n+ doped amorphous silicon film. Here, the active layer pattern of the first and second driving transistors connected to the output terminal of the gate driving circuit region has a wider line width than those of the active layer pattern of the third to seventh control transistors.

Then, after depositing a chrome ("Cr") film to a thickness of about 1500 Å on the entire surface of the substrate including the active patterns 116 and 118, the chrome film is patterned through a photolithography process using a third mask. As a result, there are formed data patterns 120 including a data line 120i disposed in a second direction perpendicular to the gate line 112g (e.g., a vertical direction), and source and drain electrodes 120a and 120b, which are overlapped with the first and second impurity regions 118a and 118b, respectively. Here, to secure sufficient capacity, the drain electrode 120b is formed to be overlapped with the capacitor lower electrode 112i, as shown in FIGS. 9A and 9B.

As shown in FIG. 9A, a data pad 120d adjacent to the gate pad 112c is formed on the gate driving circuit region. The gate pad 112c and the data pad 120d are electrically connected to each other by a contact pattern that will be formed together with a pixel electrode of the display region. Further, on the substrate of the gate driving circuit region, the branch wirings 160 comprised of the same layer as in the data pattern 120 are formed to cross the main wirings 150. To reduce the capacitance of the main wirings 150, a portion of the branch wirings 160 where the branch wring 160 and the main wiring 150 cross each other is formed to have a narrow line width.

Preferably, the source and drain electrodes 120e and 120f of the first driving transistor T1 and the second driving transistor T2 of each of the shift registers disposed in the gate driving circuit region are formed to have an interdigital structure. In other words, the even-numbered electrodes 120e are commonly connected to the left-side source pad and the odd-numbered electrodes 120f are commonly connected to the right-side drain pad. The even-numbered electrodes 120e are disposed between the odd-numbered electrodes 120f. The interdigital structure of the source and drain electrodes of the first and second driving transistors T1 and T2 increases the channel width of the driving transistor within the limited area, so that a driving ability of the transistor comprising amorphous silicon can be sufficiently secured.

Referring to FIGS. 10A and 10B, after forming the data pattern 120 and the branch wirings 160 as described above, a passivation layer 130 is formed on the entire surface of the resultant structure. The passivation layer 130 is formed of an inorganic insulating material such as silicon oxide, silicon nitride or a combination thereof, or a photosensitive organic insulating material.

Then, the passivation layer 130 is partially etched away through a photolithography process using a fourth mask to thereby form contact holes H1 through H7. That is, there are formed a first contact hole H1 exposing the drain electrode 120b of the display region, a second contact hole H2 exposing the gate pattern 112f for contact in the gate driving circuit region, a third contact hole H3 exposing the data pattern 120h for contact in the gate driving circuit region, a fourth contact hole H4 exposing the main wiring 150 and a fifth contact hole exposing the branch wiring 160. In addition, there are formed sixth and seventh contact holes H6 and H7 exposing the gate pad 112c and the data pad 120d, respectively. The sixth and seventh contact holes H6 and H7 can be classified into the contact holes exposing the contact gate pattern and the contact holes exposing the contact data pattern, just like the second and third contact holes H2 and H3. Accordingly, the contact holes exposing the gate pad 112c are regarded as one of the second contact holes H2, and the contact holes exposing the data pad 112d are regarded as one of the third contact holes H3.

A pair of contact holes H2 and H3 formed adjacent to each other is electrically connected to each other by the contact electrode that will be formed together with a pixel electrode formed in the display region.

In a reflection type LCD device having a reflective electrode of an uneven structure, numerous uneven structures are formed in the surface of the passivation layer 130 during the formation of the contact holes.

Figure 11A:
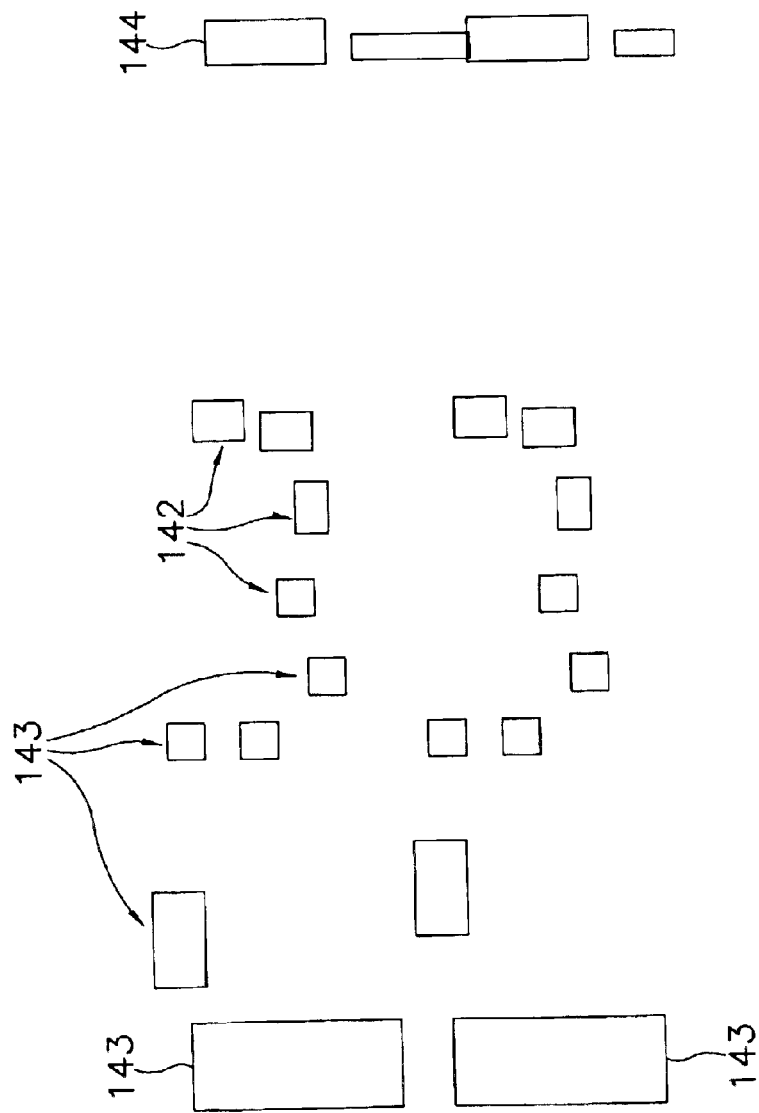
Figure 11B:
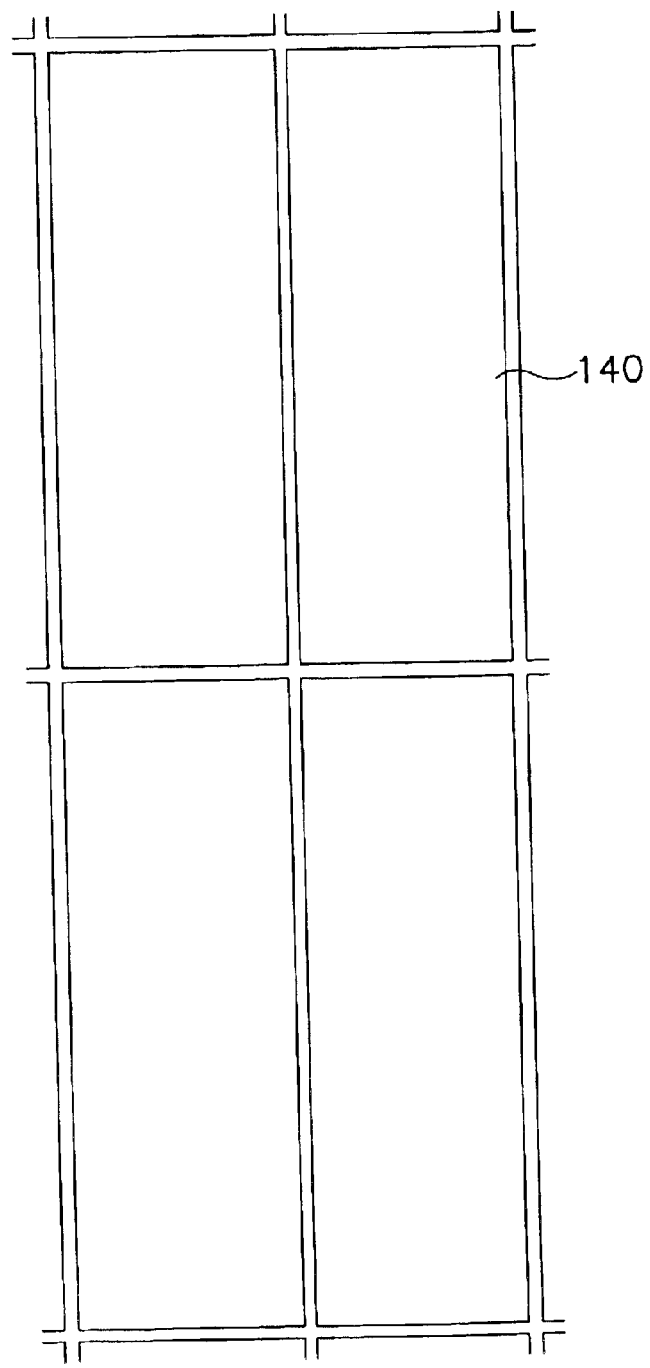

Referring to FIGS. 11A and 11B, after forming the contact holes as mentioned above, a metal film for pixel electrode, e.g., a transparent conductive film such as an ITO film or an IZO film, or an opaque reflective film such as an Al alloy film or a silver film, is deposited on the entire surface of the resultant structure. Then, the metal film is patterned through a photolithography process using a fifth mask, to thereby form the pixel electrode (or the first electrode) 140 electrically connected to the drain electrode 120b through the first contact hole H1 in the display region. In the gate driving circuit region, a second electrode 142 is formed so as to electrically connect the contact gate pattern 112f and the contact data pattern 112h through the second and third contact holes H2 and H3. In addition, a third electrode 143 is formed so as to electrically connect one of the main wirings 150 and one of the branch wirings 160 through the forth and fifth contact holes H4 and H5. In the pad region located between the display region and the gate driving circuit region, a fourth electrode 144 is formed so as to electrically connect the gate pad 112c and the data pad 112d through the sixth and seventh contact holes H6 and H7.

In the above-mentioned embodiment, the amorphous silicon TFT-LCD is manufactured using masks of 5 sheets. However, according to another embodiment of the present disclosure, the number of masks used for manufacturing an amorphous silicon TFT-LCD can be decreased down to 4 sheets by simultaneously forming active layer patterns and data patterns using one mask.

In detail, after forming the gate insulating film, an undoped intrinsic amorphous silicon film and an n-type doped extrinsic amorphous silicon film are successively deposited on the gate insulation film. After a metal film for data patterns is deposited on the entire surface of the extrinsic amorphous silicon film, a positive photosensitive film is coated to a predetermined thickness thereon and then, a mask is arranged above the photosensitive film.

In the mask, light-shielding regions correspond to source, drain and channel regions and light-transmitting regions correspond to the other regions. Particularly, the light-transmitting region between the channel region and the source region and the light-transmitting region between the channel region and the drain region have a slit structure. Since light passing through theses slits is diffracted, the gap of the slits is controlled narrower than that of the channel region. The ultraviolet rays passing the slit are diffracted to expose the photosensitive film located on the channel region. At the same time, the exposed photosensitive film of the other region is exposed to the UV rays.

The exposed photosensitive film is developed to form a photosensitive pattern where a portion corresponding to the channel region is removed to a predetermined depth. When the dry etching process is performed using the photosensitive pattern as an etching mask, the exposed metal film on which no photosensitive film is coated and the underlying extrinsic amorphous silicon film and intrinsic amorphous silicon film are removed away. At this time, the photosensitive film pattern on the channel region is also removed because it has a very thin thickness during the development process.

Next, the exposed metal film of the channel region and the underlying extrinsic amorphous silicon film are completely removed by a selective etching method, while the underlying intrinsic amorphous silicon film is removed to a predetermined depth. Thereafter, the photosensitive film pattern on the source and drain regions is removed to simultaneously form the active patterns and the data patterns including the source and drain electrodes using one mask process.

According to the present disclosure as described above, without an additional process, the gate driving circuit including the shift registers and the wirings is integrated on the insulating substrate on which a pixel array is formed. That is, several layers, which can be comprised of the same material, are formed of the same layer to thereby decrease the number of masks. Further, a conductive film for pixel electrodes connects the gate electrode and source and drain electrodes of the first transistor constituting the shift registers in the gate driving circuit with each other, thereby simplifying the manufacturing process.

Further, the main wirings for applying signals to the shift registers are formed of the same layer from the first shift register to the last shift register, so that the resistance of the main wirings is minimized to increase a field effect of the amorphous silicon TFT-LCD.

Although exemplary preferred embodiments of the present disclosure have been described, it is to be understood that the present disclosure should not be limited to those preferred embodiments, but that various changes and modifications can be made by one skilled in the art while remaining within the spirit and scope of the disclosure as hereinafter claimed.

What is claimed is:

1. An amorphous silicon thin film transistor-liquid crystal display device comprising:

a substrate including a display region and a driving circuit region;

first conducting patterns fanned on the substrate, the first conducting patterns including gate patterns and main wirings, the gate patterns including gate lines and gate electrodes protruding from the gate lines of driving transistor group and pixel transistor group formed in the driving circuit region and the display region, respectively, a gate insulating film formed on the substrate and the gate patterns;

active layer patterns formed on the gate insulating film, the active layer patterns including amorphous silicon layer;

second conducting patterns formed on the gate insulating film and the active layer patterns, the second conducting patterns including drain electrodes and source electrodes of the driving transistor group and the pixel transistor group, and branch wirings electrically connected to one of the source electrodes and the drain electrodes;

a passivation layer formed on the gate insulating film and the data patterns, the passivation layer having contact holes exposing a portion of the main wirings and the branch wirings of the driving circuit region and a portion of the drain electrodes of the display region; and third conducting patterns formed on the passivation layer and including first electrodes electrically connected to one of the drain electrodes of the display region through one of the contact holes and a second electrode electrically connecting one of the main wirings to one of the branch wirings through one of the contact holes.

2. The device of claim 1, wherein the driving transistor group comprises a plurality of shift registers.

3. The device of claim 2, wherein each shift register comprises a pull-up section that provides a corresponding clock signal of first and second clock signals to an output terminal, a pull-down section that provides a first power source to the output terminal, a pull-up driving section that drives the pull-up section such that the pull-up driving section responds to the end of the input signal to change a capacitor for turning on the pull-up section and responds to the end of the output signal of the next shift register to discharge the capacitor for turning off the pull-up section, and a pull-down driving section that drives the pull- down section such that the pull-down driving section responds to the end of the input signal to turn on the pull-down section and responds to the end of the output signal of next shift register to turn off the pull-down section.

4. The device of claim 3, wherein the main wirings comprise a first power source line that transfers the first power source, a first clock signal line that transfers the first clock signal, a second clock signal line that transfers the second clock signal of which phase is opposite to the first clock signal and the second power source line.

5. The device of claim 4, wherein the pull-up section comprises a first driving transistor having a drain electrode electrically connected to the clock signal input terminal, a gate electrode electrically connected to a third node and a source electrode electrically connected to the output terminal.

6. The device of claim 4, wherein the pull-down section comprises a second driving transistor having a drain electrode electrically connected to the output terminal, a gate electrode electrically connected to a fourth node, and source electrically connected to the clock signal input terminal.

7. The device of claim 4, the pull-up driving section comprises a capacitor, third, fourth and fifth control transistors, the capacitor is connected between the third node and the output terminal, the third control transistor has a drain electrode electrically connected to the second power source line, a gate electrode electrically connected to an input terminal and a source electrode electrically connected to the third node, the fourth control transistor has a drain electrode electrically connected to the third node, a gate electrode electrically connected to the control terminal and a source electrode electrically connected to the first power source line, and the fifth control transistor has a drain electrode connected to the third node, a gate electrode electrically connected to the fourth node and a source electrode electrically connected to the first power source line.

8. The device of claim 4, the pull-down driving section comprises sixth and seventh control transistors, drain and gate electrodes of the sixth control transIstor are electrically connected to the second power source line in common, while the source of the sixth control transistor is electrically connected to the fourth node, and the seventh control transIstor has a drain electrode electrically connected to the fourth node, a gate electrode electrically connected to the third node and a source electrode electrically connected to the first power source line.

9. The device of claim 1, wherein the first conducting patterns comprise a chromium (Cr) layer and an aluminum neodymium (AlNd) layer.

10. The device of claim 1, wherein the gate insulation layer comprises silicon nitride (SiNx).

11. The device of claim 1, wherein the second conducting patterns comprise a chromium layer.

12. The device of claim 1, wherein the source and drain electrodes of the driving circuit region have an interdigital structure having multi-channels and are spaced apart from each other.

13. The device of claim 1, wherein the driving transistor group is disposed in the driving circuit region such that the driving transistor group is interposed between the main wirings and the display region.

14. The device of claim 1, wherein the branch wirings cross the main wirings.

15. The device of claim 14, wherein a portion of the branch wirings where the branch wiring and the main wiring cross each other have a line width narrower than that of the branch wiring.

16. The device of claim 1, wherein the third conducting patterns comprise transparent and conductive material.

17. The device of claim 1, wherein the third conducting patterns comprise opaque conductive material having high reflectivity.

18. A method of manufacturing an amorphous silicon thin film transistor liquid crystal display device comprising:

forming first conducting patterns formed on a substrate including a display region and a driving circuit region, the first conducting patterns including gate patterns and main wirings, the gate patterns including gate lines and gate electrodes protruding from the gate lines of driving transistor group and pixel transistor group formed in the driving circuit region and the display region, respectively, forming a gate insulating film on the substrate and the gate patterns;

forming active layer patterns on the gate insulating film, the active layer patterns including amorphous silicon layer:

forming second conducting patterns on the gate insulating film and the active layer patterns, the second conducting patterns including drain electrodes and source electrodes of the driving transistor group and the pixel transistor group, and branch wirings electrically connected to one of the source electrodes and the drain electrodes;

forming a passivation layer on the gate insulating film and the data patterns, the passivation layer having contact holes exposing a portion of the main wirings and the branch wirings of the driving circuit region and a portion of the drain electrodes of the display region; and forming third conducting patterns on the passivation layer and including first electrodes electrically connected to one of the drain electrodes of the display region through one of the contact holes and a second electrode electrically connecting one of the main wirings to one of the branch wirings through one of the contact holes.

19. The method of claim 18, wherein the first conducting patterns are formed by:

forming a chromium layer on the substrate such that the chromium layer has a thickness of about 500 angstroms; and forming an aluminum neodymium layer on the chromium layer such that the aluminum neodymium layer has a thickness of about 2000 angstroms.

20. The method of claim 18, wherein the gate insulation layer comprises silicon nitride (SiNx) and has a thickness of about 4500 angstroms.

21. The method of claim 18, wherein the second conducting patterns comprise chromium and have thickness in a range of about 1500 angstroms to about 4000 angstroms.

* * * * *